United States Patent [19]

Stabile

[11] Patent Number: 4,872,039
[45] Date of Patent: Oct. 3, 1989

[54] BURIED LATERAL DIODE AND METHOD FOR MAKING SAME

[75] Inventor: Paul J. Stabile, Middletown Township, Bucks County, Pa.

[73] Assignee: General Electric Company, Schenectady, N.Y.

[21] Appl. No.: 73,897

[22] Filed: Jul. 13, 1987

Related U.S. Application Data

[63] Continuation of Ser. No. 855,602, Apr. 25, 1986, abandoned.

[51] Int. Cl.⁴ ............................................. H01L 29/90
[52] U.S. Cl. ........................................ 357/13; 357/55; 357/20; 357/89; 357/90; 357/91
[58] Field of Search ................... 357/13, 20, 23, 55, 357/89, 90, 91

[56] References Cited

U.S. PATENT DOCUMENTS

| | | | |
|---|---|---|---|
| 3,374,404 | 3/1968 | Lueke | 317/234 |
| 3,396,317 | 8/1968 | Vendelin | 317/234 |
| 3,981,073 | 9/1976 | Dully | 29/580 |
| 4,079,402 | 3/1978 | Dunkley et al. | 357/13 |
| 4,091,408 | 5/1978 | Lee et al. | 357/56 |
| 4,201,604 | 5/1980 | Bierig et al. | 357/13 |
| 4,331,967 | 5/1982 | Kurumada et al. | 357/3 |
| 4,405,933 | 9/1983 | Avery | 357/13 |
| 4,525,732 | 6/1985 | Bayraktaroglu | 357/13 |
| 4,597,824 | 7/1986 | Shinada et al. | 357/91 |

Primary Examiner—Edward J. Wojciechowicz
Attorney, Agent, or Firm—Henry I. Steckler; James C. Davis, Jr.; Paul R. Webb, II

[57] ABSTRACT

A diode in a semiconductor body has two laterally adjacent regions. Each region has buried portions. The first and second regions are doped with opposite conductivity type dopants. A buried P-N junction exists where the buried portions meet. Since the junction is buried, surface breakdown effects are greatly reduced. The lateral orientation provides for easier series connection or several such diodes. A method for making a diode in a body comprises forming two laterally adjacent buried portions of respective opposite conductivity type regions. A contact portion of at least one region is formed extending to the surface of the body.

13 Claims, 2 Drawing Sheets the invention.

BURIED LATERAL DIODE AND METHOD FOR MAKING SAME

This is a continuation of application Ser. No. 855,602, filed Apr. 25, 1986, now abandoned.

BACKGROUND OF THE INVENTION

The present invention relates to diodes, and more particularly to diodes having a buried lateral construction suitable for integrated circuits.

An impact-avalanche-and-transit-time (IMPATT) diode is a desirable component for use as a generator of microwave frequency radiation due to its simplicity. However, its input resistance is low compared to a standard 50 ohm transmission line at these frequencies and its input capacitance is relatively high, resulting in restricted bandwidth. A solution to these problems would be to couple several such diodes in series in order to raise the input resistance and lower the input capacitance. However, such a diode is usually formed in a vertical (perpendicular to a substrate) configuration, which makes a series connection impractical due to the difficulty of making a connection from the bottom electrode of one diode to the top electrode of another diode when the diodes are made in integrated circuit (IC) form. U.S. Pat. No. 3,981,073 discloses a lateral semiconductor Gunn device adjacent an oxide and expressly suggests a similar construction for an IMPATT diode in the penultimate paragraph of the detailed description thereof. However, while a Gunn device has only regions of a single conductivity type with an applied electric field distributed across all the regions, an IMPATT diode has a P-N junction having a high electric field thereacross. This can result in voltage breakdown of the IMPATT diode due to crystal defects at the oxide-semiconductor interface before the critical field necessary for oscillation is achieved. Further, carriers can become trapped in the oxide and surface states of the semiconductor, which reduces the efficiency of the diode since trapped carriers, even if remitted, will usually be out of phase with the avalanche current.

It is, therefore, desirable to have a diode that can be made in IC form that can be readily series coupled with other such diodes and which resists voltage breakdown and loss of efficiency.

SUMMARY OF THE INVENTION

A diode comprises a semiconductor body having therein: a first region of a first conductivity type, a second region of a second conductivity type opposite to said first conductivity type and having a contact portion extending to a surface of the body, and a buried junction comprising a buried portion of said first region and a buried portion of said second region laterally adjacent said buried portion of said first region.

A method of making a diode in a semiconductor body comprises forming a buried portion of a first region of a first conductivity type, forming a buried portion of a second region of a second conductivity type opposite to said first conductivity type laterally adjacent said buried portion of said first region, and forming a contact portion for said second region.

DESCRIPTION OF THE DRAWING

In the Figures, corresponding elements are designated with corresponding reference numbers.

DETAILED DESCRIPTION OF THE PREFERRED EMBODIMENTS

Figure 1:
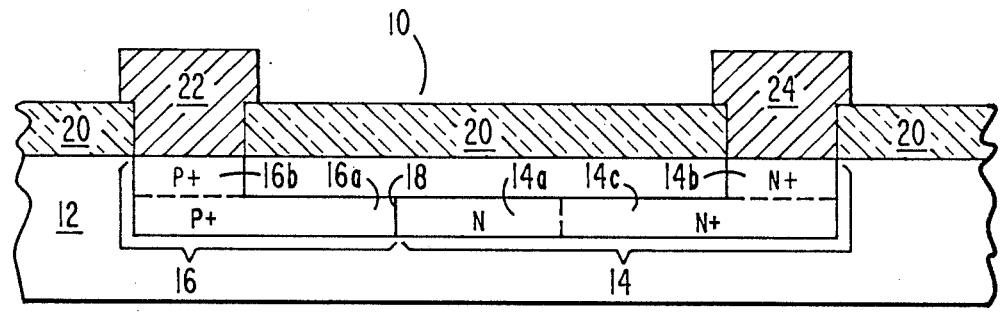
FIG. 1 is a cross-sectional view of a first embodiment of an IMPATT diode in accordance with the invention.

FIG. 1 shows a diode 10, such as a buried lateral IMPATT diode, that is constructed in a body 12. The diode 10 comprises a first region 14 of a first conductivity type and a second region 16 of a second conductivity type opposite to said first conductivity type. The first region 14 comprises a moderately doped buried portion 14a, a heavily doped contact portion 14b, and a heavily doped buried intermediate portion 14c. The second region 16 comprises a heavily doped buried portion 16a and a heavily doped contact portion 16b. The buried portions 14a and 16a are laterally adjacent to each other to form a buried P-N junction 18. By "buried" is meant that all of a region, or all of a portion of a region, or all of a junction is disposed away from any surface of the body 12; by "contact portion" is meant that the portion extends to a surface of the body 12; by "lateral" is meant a direction substantially parallel to the surface of the body 12 that has portions of the regions extending thereto. Overlaying the body 12 is an insulating layer 20, while overlaying the contact portions 14b and 16b are conductive layers 22 and 24, respectively.

The body 12 can be a high resistivity semiconductor, such as Si or GaAs. A high resistivity, such as at least 2000 ohm-cm, is desirable to minimize current spreading far from the lateral diode 10, which reduces the efficiency thereof or even prevents achieving a sufficient current density, e.g. 1000 A/cm$^2$ at X-band, for oscillation to occur. The first and second conductivity types of the first and second regions 14 and 16 can be N and P types, respectively, as shown in FIG. 1; however, it will be readily appreciated that the first and second conductivity types can be P and N types, respectively. Further, in the present invention the buried portion 14a of the first region 14 serves as a single "drift region". The insulating layer 20 can comprise an oxide, such as SiO$_2$. The conductive layers 22 and 24 can comprise a metal, such as Al, or a compound structure, such as a Cr bottom layer and an Au top layer.

In operation, negative and positive voltages are applied to the conductive contacts 22 and 24, respectively, thereby reverse biasing the junction 18. If the field inside the diode 10 is high enough, i.e. a field sufficient to produce avalanche multiplication, oscillation will occur at a frequency which depends primarily upon the width of the depletion region in the buried portion 14a adjacent the junction 18, which in turn depends upon the doping level in the buried portion 14a. The electric field is highest at the edges of the junction 18, but since the buried portions 14a and 16a of the body 12 are all of the same material, there are an insufficient number of traps and crystal defects present at the junction edges to cause edge breakdown at a voltage lower than the avalanche voltage. Further, since the buried portions 14a and 16a are not disposed adjacent the insulating layer 20 or the top surface of the body 12, only an insignificant percentage of carriers become trapped therein, resulting in a relatively high efficiency for the diode 10.

Figure 2:
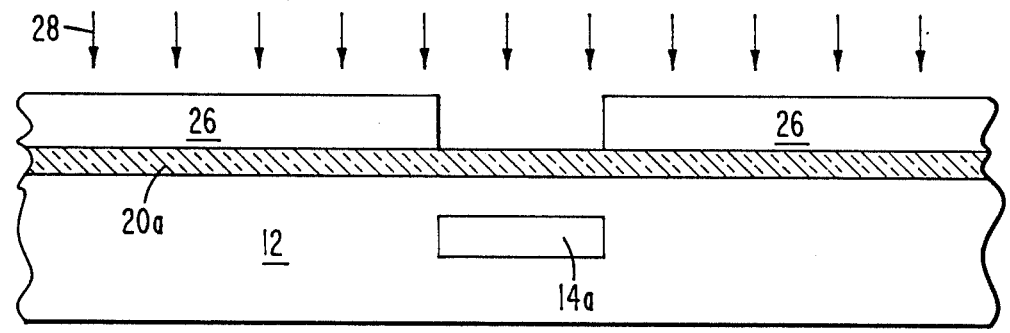
FIGS. 2–5 are cross-sectional views of structures existing during successive manufacturing steps of the diode of FIG. 1.

FIG. 2 shows a first portion 20a of the insulting layer 20, which is grown in a steam ambient at about 1100° C. to a thickness of about 500 nanometers (nm). Then a first photoresist layer 26 is deposited and defined. Thereafter, an ion implantation step is performed as indicated by the arrows 28 with an N-type dopant, such as P, with an energy of about 2 megaelectron volts (MeV) and an areal density of about $1 \times 10^{11}$ ions/cm² to form the buried portion 14a with a length of about 5000 nm for X-band operation. This gives a doping level of about $4 \times 10^{15}$ ions/cm³, which also is for X-band (8.2 to 12.4 GHz) operation. In general, the higher the oscillation frequency of the diode 10, the higher the required doping level of the buried portion 14a.

Further, it is desirable to have the top of the buried portion 14a as far as possible from the top surface of the body 12 to avoid surface effects on the current therein. Also, the bottom of the buried portion 14a should be as deep as possible in order to maximize the cross-sectional area thereof that is perpendicular to the direction of current flow in order to maximize the current therein; however, the bottom of the buried portion 14a should not be so deep as to be near the bottom of the body 12 so as to minimize surface effects. In a particular embodiment, the depth of the top of the buried portion 14a was about 1000 nm and the thickness of portion 14a was also 1000 nm.

Figure 3:
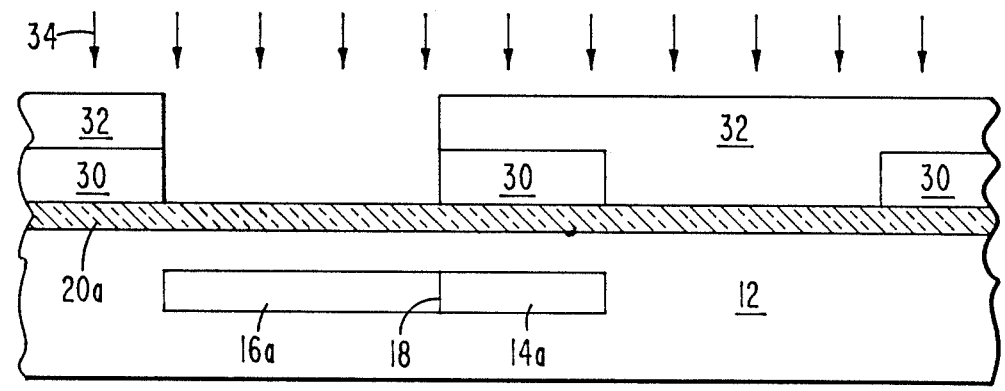

FIG. 3 shows that the first photoresist layer 26 is removed and second photoresist layer 30 is deposited and defined. Then a third photoresist layer 32 is deposited and defined. As indicated by arrows 34, ion implantation of a P-type dopant, such as B, is done. Two energies, about 0.4 and 0.8 MeV, are used with an areal density of about $6 \times 10^{15}$ ions/cm² to form the buried portion 16a of the second region, and therefore also form the junction 18.

Figure 4:
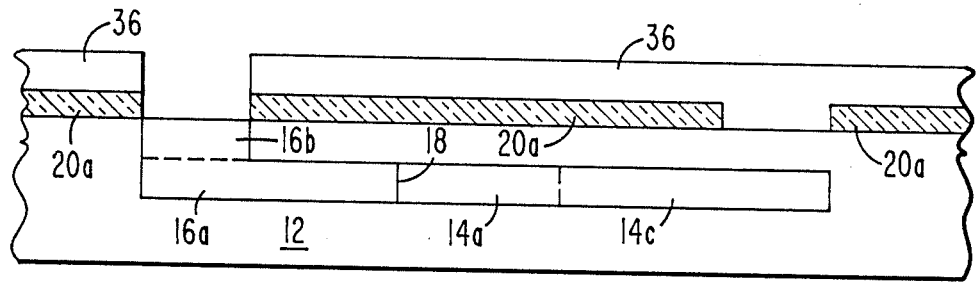

The third photoresist layer 32 is then removed and a fourth photoresist layer (not shown) is deposited and defined so as to cover the buried portion 16a and expose the area for the buried intermediate portion 14c of the first region 14. An ion implantation of P at between about 1 and 2 MeV at an area density of about $6 \times 10^{15}$ ions/cm² is done to form the buried intermediate portion 14c (FIG. 4) of the first region 14.

Figure 5:
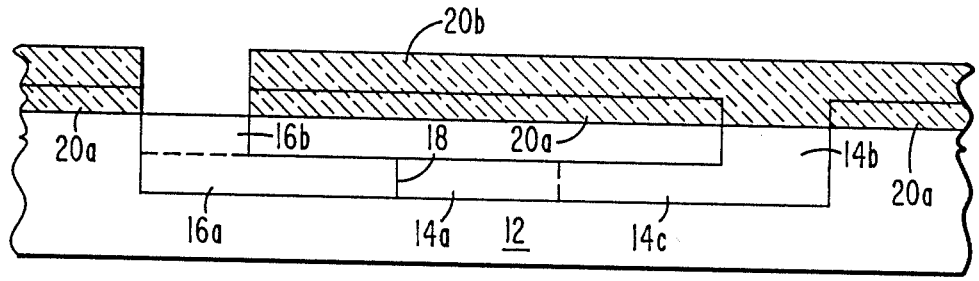

Then plasma etching is used to define openings in the first portion 20a of insulting layer 20. A fifth photoresist layer 36 is deposited and defined. Then B is implanted at 0.1 and 0.2 MeV at an areal density of about $5 \times 10^{15}$ ions/cm² to form the contact portion 16b of the second region 16. Similarly, the fifth photoresist layer is removed and a sixth photoresist layer (not shown) is deposited and defined. Then P is ion implanted at energies of 0.2 MeV and then 0.4 MeV and an areal density of about $5 \times 10^{15}$ ions/cm² to form the contact portion 14b (FIG. 5) of the first region 14.

Then a second and final portion 20b of the insulating layer 20 is formed by chemical vapor deposition at a temperature of the body 12 of about 400° C. to a thickness of about 500 nm. Thereafter, the body 12 is pulse laser or flash annealed to activate the implanted ions. Then openings are formed in the insulating layer 20 and the metals comprising the conductive layers 22 and 24 successively deposited and defined.

Figure 6:
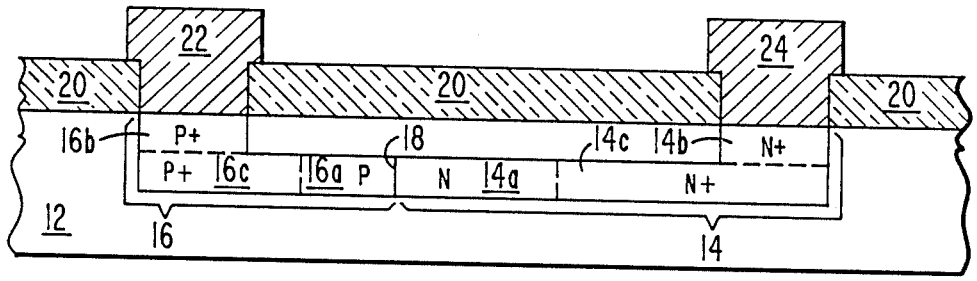
FIG. 6 is a cross-sectional view of a second embodiment of an IMPATT diode of the invention.

The second embodiment shown in FIG. 6 is similar to FIG. 1 except that the first portion 16a is moderately doped and there is a heavily doped buried intermediate portion 16c. Thus there are two drift regions namely the first portions 14a and 16a of the first and second regions 14 and 16, respectively. Construction of this embodiment is similar to that described above except that a separate implantation step of the portion 16a is required. Further, the lengths of the portions 14a and 16a is about 3500 nm each, while they are formed with an areal density of about $2 \times 10^{11}$ ions/cm² to provide a doping level of $7 \times 10^{15}$ ions/cm³, all for X-band.

Figure 7:
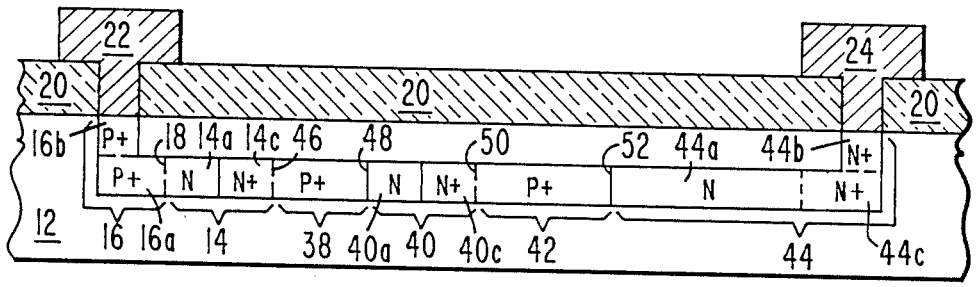
FIG. 7 is a cross-sectional view of a third embodiment having series coupled diodes.

The third embodiment of FIG. 7 shows a plurality of single drift diodes series connected to raise the input resistance and lower the input capacitance. The second region 16 is the same as that of FIG. 1. The first region 14 comprises two portions, a moderately doped N-conductivity type buried portion 14a, and a heavily doped N-conductivity type buried portion 14c. Adjacent thereof is a heavily doped P-conductivity type buried third region 38 forming a P-N junction 46 with the portion 14c. Next is a buried fourth region 40 comprising a moderately doped N-conductivity type buried portion 40a forming a P-N junction 48 with third region 38, and a heavily doped N-conductivity type buried portion 40c. Next is a buried heavily doped fifth region 42 of P-conductivity type forming a P-N junction 50 with the portion 40c. Next is an N-conductivity type sixth region 44 having a moderately doped buried portion 44a forming a P-N junction 52 with the fifth region 42, a heavily doped buried intermediate portion 44c and a heavily doped contact region 44b.

It will be seen that with positive and negative voltages applied to the conductive layers 24 and 22, respectively, the P-N junction 18, 48, and 52 will be reversed biased so that oscillations can occur thereat, while the P-N junctions 46 and 50 are forward biased to provide a low resistance series path.

It will be appreciated that the present invention can be used in still other embodiments, e.g. an ordinary diode to obtain a high voltage breakdown and ease of coupling diodes together. Further, the method of the invention can comprise growing a first epitaxial layer on a body, forming the buried regions therein, growing a second epitaxial layer, and then forming the contact regions in the second layer.

What is claimed is:

1. An oscillating diode comprises a semiconductor body of a resistivity of at least 2000 ohm-cm and having therein:
   a first region of a first conductivity type;
   means for coupling said first region to the surface of said body;
   a second region of a second conductivity type opposite to said first conductivity type having a contact portion extending to a surface of said body, said first and second regions having a lower resistivity than said body;
   a pair of conducting layers overlying said coupling means and said contact portion, respectively; and
   a buried junction comprising a buried portion of said first conductivity type and of said first region and a buried portion of said second conductivity type and of said second region laterally adjacent said buried portion of said first region.

2. The diode of claim 1 wherein said first conductivity type is N-type and said second conductivity type is P-type.

3. The diode of claim 1 wherein said coupling means comprises said first region having a contact portion of said first conductivity type and extending to a surface of said body.

4. The diode of claim 3 wherein said contact portions extend to the same surface of said body.

5. The diode of claim 3 wherein said coupling means further comprises said first region having an intermediate portion of said first conductivity type and disposed between said contact and said buried portions of said first region, said intermediate portion having a lower resistivity than said buried portion of said first region.

6. The diode of claim 5 wherein said contact and intermediate portions are heavily doped, and said buried portions of said first and second regions are moderately and heavily doped, respectively.

7. The diode of claim 3 wherein said first and second regions each further comprises an intermediate portion disposed between the contact and the buried portions thereof and of said first and second conductivity types, respectively, said intermediate portions having a lower resistivity than said buried portions in the same region.

8. The diode of claim 7 wherein said buried portions are moderately doped, and said contact and intermediate portions are heavily doped.

9. The diode of claim 1 wherein said semiconductor comprises gallium arsenide.

10. The diode of claim 1 wherein said semiconductor comprises silicon.

11. The diode of claim 1 wherein said buried portions are spaced a distance of about 1000 nm from a surface of said body.

12. The diode of claim 1 wherein said coupling means further comprises:
   a third buried region of said second conductivity type laterally adjacent said first region; and
   a fourth buried region of said first conductivity type laterally adjacent said third region.

13. The diode of claim 12 wherein said coupling means further comprises a fifth buried region of said second conductivity type laterally adjacent said fourth region; and
   a sixth region of said first conductivity type having a buried portion of said first conductivity type laterally adjacent said fifth region, and a contact portion of said first conductivity type.

* * * * *

UNITED STATES PATENT AND TRADEMARK OFFICE
CERTIFICATE OF CORRECTION

PATENT NO. : 4,872,039

DATED : October 3, 1989

INVENTOR(S) : P.J. Stabile et al.

It is certified that error appears in the above-identified patent and that said Letters Patent is hereby corrected as shown below:

On the cover page, item [75] after "County," insert -- and Bogoljub Lalevic, City of Philadelphia, Philadelphia County, both of --.

Signed and Sealed this

Seventh Day of August, 1990

Attest:

HARRY F. MANBECK, JR.

Attesting Officer

Commissioner of Patents and Trademarks